United States Patent [19]

Juskey et al.

[11] Patent Number: 5,296,046
[45] Date of Patent: Mar. 22, 1994

[54] SUBLIMING SOLDER FLUX COMPOSITION

[75] Inventors: Frank J. Juskey, Coral Springs; Douglas W. Hendricks, Boca Raton, both of Fla.

[73] Assignee: Motorola, Inc., Schaumburg, Ill.

[21] Appl. No.: 106,671

[22] Filed: Aug. 16, 1993

[51] Int. Cl.$^5$ .............................................. B23K 35/34
[52] U.S. Cl. ........................................ 148/23; 148/24; 148/25
[58] Field of Search .................................... 148/23-25

[56] References Cited

U.S. PATENT DOCUMENTS

| | | | |
|---|---|---|---|
| 5,064,481 | 11/1991 | Davis et al. | 148/23 |
| 5,094,701 | 3/1992 | Norman | 148/25 |
| 5,211,763 | 5/1993 | Takemoto | 148/25 |

*Primary Examiner*—Peter D. Rosenberg
*Attorney, Agent, or Firm*—Dale W. Dorinski

[57] ABSTRACT

A fluxing composition for soldering metals together, contains a carrier solvent, an oxide removing agent, and a nitrogen liberating compound. The oxide removing agent sublimes at or below the temperature at which the metals are soldered together. The nitrogen liberating compound sublimes or decomposes at below the temperature at which the metals are soldered together in order to provide a blanket of inert gas over the metals being soldered. The oxide removing agent is 2-amino-isophthalic acid, 5-amino-isophthalic acid, isophthalic acid, ammonium fluoborate, or ammonium salicylate. The compound that liberates nitrogen upon heating is 1,2-benz-3,4-anthraquinone, 1,2-benz-9,10-anthraquinone, 5,6-chrysoquinone, 6,12-chrysoquinone, 2,3-benzanthraquinone, 2-amino-isophthalic acid, 5-amino-isophthalic acid, or 5-isoquinoline carboxylonitrile. Electronic components are soldered to a circuit board by applying the fluxing composition to the circuit board. The fluxing composition, the component and the circuit board are heated to a temperature sufficient to cause the activator to react with metal oxides on either the component or the circuit board and to sublime, and also to a temperature to cause the nitrogen containing compound to decompose or sublime.

14 Claims, No Drawings

SUBLIMING SOLDER FLUX COMPOSITION

TECHNICAL FIELD

This invention relates in general to solder flux formulations and more particularly to low residue solder fluxes that sublime during the soldering process.

BACKGROUND

Solder flux formulations typically consist of a fluxing component or agent dispersed or dissolved in an aqueous or organic solvent. These fluxes are generally applied to surfaces or locations required to be soldered together. The application of the flux is performed in any number of ways, such as coating, dispensing, dipping, spraying, or otherwise selectively or globally depositing the flux on the surfaces to be soldered together. In the electronics industry, for example, electronic components are soldered to printed circuit boards. A solderable material, typically a tin-lead alloy, is applied either to the component, the circuit board, or both, along with the flux, and the assembly is heated and the flux activates the surfaces of the metals. When the solder melts, it alloys with both the electronic component and the printed circuit board, to form an electrical and mechanical joint between the component and the circuit board.

For most uses in the electronics industry, it is desirable to use a flux composition which is non-corrosive and non-conducting. For this reason, rosin based flux compositions are widely used in the commercially available fluxes made specifically for manufacturing surface mounted electronic assemblies. If more reactive fluxing compositions are used, they typically leave residues which are corrosive and/or conductive. However, higher reactivity is, in some ways, desirable, in that it aids in removing oxides which may form on the metal surfaces to be soldered, thereby providing a strong solder bond. However, the use of such fluxes also has a number of disadvantages. Because the residues from rosin based fluxes tend to be sticky, they interfere with automatic testing of the circuit, and unsightly, attract dirt and moisture from the environment, they prevent effective encapsulation or conformal coating of the circuitry, and are hygroscopic.

Because of these disadvantages, flux residues are typically removed in a post-solder cleaning operation. A common procedure is to use an aqueous or organic solvent to remove the flux residues. Water is preferred because it does not leave an objectionable residue. However, water is typically an ineffective agent since many of the residues, such as the rosin, are only slightly soluble in water. Organic solvents are more effective but are less desirable because they are expensive to purchase initially, and are also expensive and difficult to dispose of. One class of organic solvents that has historically obtained widespread use is the chlorofluorocarbons (CFCs) because they are inert and volatilize after cleaning. CFCs have recently come under strong attack because of their tendency to deplete the ozone layer. With severe restrictions placed on the manufacture and use of CFCs, it is clear that this method of cleaning will be totally unsuitable in the near future.

For these and other reasons, the prior fluxing compositions are not preferred, and it would be advantageous to discover a new fluxing composition that would avoid one or more of these disadvantages.

SUMMARY OF THE INVENTION

Briefly, according to the invention, there is provided a fluxing composition for soldering metals together. The fluxing composition contains a carrier solvent, an oxide removing agent, and a nitrogen liberating compound. The oxide removing agent sublimes at or below the temperature at which the metals are soldered together. The nitrogen liberating compound sublimes or decomposes at below the temperature at which the metals are soldered together in order to provide a blanket of inert gas over the metals being soldered.

In an alternate embodiment of the invention, the oxide removing agent is a chemical compound, such as 2-amino-isophthalic acid, 5-amino-isophthalic acid, isophthalic acid, ammonium fluoborate, or ammonium salicylate.

In a further embodiment of the invention, the compound that liberates nitrogen upon heating is, for example, 1,2-benz-3,4-anthraquinone, 1,2-benz-9,10-anthraquinone, 5,6-chrysoquinone, 6,12-chrysoquinone, 2,3-benzanthraquinone, 2-amino-isophthalic acid, 5-amino-isophthalic acid, or 5-isoquinoline carboxylonitrile.

In still another embodiment of the invention, a method of soldering electronic components to a circuit board comprises applying a fluxing composition containing an activator in a nitrogen containing compound to the circuit board. The fluxing composition, the component and the circuit board are heated to a temperature sufficient to cause the activator to react with metal oxides on either the component or the circuit board and to sublime, and also to a temperature to cause the nitrogen containing compound to decompose or sublime.

DETAILED DESCRIPTION OF THE PREFERRED EMBODIMENT

While the specification concludes with claims defining the features of the invention that are regarded as novel, it is believed that the invention will be better understood from a consideration of the following description.

A low residue solder flux composition has been discovered that contains a carrier solvent, an activator or oxide removing agent, and a nitrogen containing compound. This fluxing composition is particularly suitable for use with soft solders, such as the tin-lead eutectic alloy. Other tin-lead alloys containing elements such as silver, bismuth, antimony, indium, and so on, may also be used. These and other types of alloys are typically employed as solders to provide electrical interconnections in the manufacture of electronic assemblies, such as computers and portable radios. In one aspect of the invention, the carrier solvent is an alcoholic compound or blend of alcoholic compounds. In the preferred embodiment, isopropanol or n-heptanol is used. Other alcohols, such as methyl, ethyl, propyl, and butyl, and so on, may also be employed along with mixtures of these materials.

In order to provide a soldering flux that has littler or no residue, it is desirable that the components used as activators or oxide removing agents, not remain on the circuit board after solder reflow. This also means that the reaction by-products of these materials also should not remain on the board. The oxide removing agents of this invention are specifically selected to be chemical compounds which sublime at or below the temperatures at which the soldering operation takes place. For purposes of clarification, the term "sublime" means to change from a solid to a gaseous state without passing through the liquid phase, that is, materials that sublime pass directly from a solid state to a gaseous state upon heating. The sublimation point of a material is that temperature at which the vapor pressure of the solid phase of the compound is equal to the total pressure of the gas phase in contact with it. This is analogous to the boiling point of a liquid. One skilled in the art may readily see the advantage of using solder flux activators that sublime. By eliminating the liquid phase, we can now be assured that when the soldering operation is completed, the solder flux residues will have totally vaporized from the printed circuit board assembly and no liquid or solid materials will remain behind as in the conventional art. One skilled in the art will also recognize that subliming materials have an appreciable vapor pressure below their sublimation point and will slowly pass into a gaseous phase in a manner similar to the evaporation of liquids. That is to say, that subliming materials are capable of "evaporating" at temperatures significantly below their sublimation point. This phenomena also aids in ensuring that the printed circuit board will be residue free after the soldering operation. If, per chance, any residues do remain after soldering, they will slowly sublime to a gaseous phase and eventually, all traces of the residue will disappear from the circuit board.

Certain materials that have been found to be useful as activators in this invention are shown in Table 1, below. These materials provide oxide removal or are capable of reducing metal oxides. This list is by no means comprehensive, and one skilled in the art will certainly realize that other materials capable of reducing oxides and that also exhibit subliming behavior may be suitably employed.

TABLE I

| Description | Formula | MP (°C.) | MW |
|---|---|---|---|
| Isophthalic Acid (Benzene Dicarboxylic Acid) | $C_8H_6O_4$ | sub 348 | 166.1 |
| Ammonium Fluoborate | $NH_4BF_6$ | sub | 104.8 |
| Ammonium Salicylate | $C_7H_9NO_3$ | sub | 155 |
| 2-Amino-Isophthalic Acid | $C_8H_7NO_4$ | 260,267 sub. | 181.5 |
| 5-Amino-Isophthalic Acid | $C_8H_7NO_4$ | >360 sub | 181.5 |

The third component of the subliming solder flux composition is a chemical compound that contains a nitrogen atom. The selected compound also exhibits the properties of either subliming or decomposing at or below the temperature at which the soldering operation occurs, to liberate nitrogen or a nitrogen containing compound. The purpose of this action is to provide a blanket of oxygen-free gas over the activated or cleaned metal surfaces of the electronic component and the circuit board. Once the oxides are removed from the metal surfaces by the activating agent, it is very important to maintain these surfaces in an oxide free state until the solder has alloyed with the metal. The oxygen-free gas blanket serves to provide this function. Table II, below, lists a number of materials that have been found to be particularly suitable for use in the invention. It should be noted that each of these materials either sublimes or decomposes at or near a temperature which soldering of soft solders typically takes place.

TABLE II

| Description | Formula | MP (°C.) | MW |
|---|---|---|---|
| 1,2-Benz-3,4-Anthraquinone | $C_{18}H_{10}O_2$ | 262 d | 258.3 |
| 1,2-Benz-9,10-Anthraquinone | $C_{18}H_{10}O_2$ | 169 sub | 258.3 |

TABLE II-continued

| Description | Formula | MP (°C.) | MW |
|---|---|---|---|
| 5,6-Chrysoquinone | $C_{18}H_{10}O_2$ | 239.5 sub | 258.3 |
| 6,12-Chrysoquinone | $C_{18}H_{10}O_2$ | 288–290 d | 258.3 |
| 9,10-Napthanene quinone (2,3-Benzanthraquinone) | $C_{18}H_{10}O_2$ | 294 sub | 258.3 |
| 2-Amino-isophthalic acid | $C_8H_7O_4$ | 260, 267 sub | 181.5 |
| 5-Amino-isophthalic acid | $C_8H_7O_4$ | >360 sub | 181.5 |
| 5-Isoquinone carboxylnitrile (5-Cyanoisoquinone) | $C_{10}H_6N_2$ | 135 sub | 154.8 |

The heat of the soldering operation causes these materials to react or sublime, thereby providing the desired effect. The ability to sublime, as in the case of the activator, is desirable in providing the benefits intended to be realized in the instant invention.

In a preferred embodiment of the invention, a formulation of a solder flux is outlined in Example I, below.

EXAMPLE I

| Example I | |
|---|---|
| Isopropanol | 80% by volume |
| Heptanol | 10% by volume |
| 2,3-Benzanthraquinone | 6% by volume |
| Ammonium Tetrafluoborate | 1% by volume |
| 4-Amino-Isophthalic Acid | 3% by volume |

EXAMPLE II

| Example II | |
|---|---|
| Isopropanol | 80% by volume |
| N-Heptanol | 10% by volume |
| 2,3-Benzanthraquinone | 6% by volume |
| Ammonium Salicylate | 2% by volume |
| 4-Amino-Isophthalic Acid | 1% by volume |
| 5-Isoquinoline Carboxylnitrile | 1% by volume |

The solder fluxing compositions, as disclosed herein, may also be employed as a solder flux in a solder paste. Solder pastes or solder creams are typically dispersions of small particles of solder in a vehicle, such as the fluxing composition outlined above. In addition, the fluxing composition can be applied directly to solder clad printed circuit boards in order to provide a surface ready to be soldered. This fluxing composition then acts as a coating or tacking agent to aid in the process of placement and reflow of the electronic components on the board.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A fluxing composition for soldering metals together at a soldering temperature, comprising:
   a carrier solvent;
   an oxide removing agent that sublimes at or below the soldering temperature; and
   a compound that liberates nitrogen at or below the soldering temperature.

2. The fluxing composition of claim 1, wherein the carrier solvent is an alcohol.

3. The fluxing composition of claim 1, wherein the oxide removing agent is selected from the group consisting of 2-amino-isophthalic acid; 5-amino-isophthalic acid; isophthalic acid; ammonium fluoborate; and ammonium salicylate.

4. The fluxing composition of claim 1, wherein the nitrogen liberating compound is a polynuclear aromatic compound.

5. The fluxing composition of claim 1, wherein the nitrogen liberating compound is selected from the group consisting of 1,2-benz-3,4-anthraquinone; 1,2-benz-9,10-anthraquinone; 5,6-chrysoquinone; 6,12-chrysoquinone; 2,3-benzanthraquinone; 2-amino-isophthalic acid; 5-amino-isophthalic acid; and 5-isoquinoline carboxylonitrile.

6. A fluxing composition for soldering two metals or metal alloys together, comprising:
    an activator present in an amount sufficient to provide fluxing capability, the activator being characterized in that it reduces metal oxides and sublimes at the temperatures at which the metals are soldered together;
    a nitrogen containing compound, characterized in that it sublimes at the temperatures at which the metals are soldered together.

7. The fluxing composition of claim 6, wherein the activator is selected from the group consisting of 2-amino-isophthalic acid; 5-amino-isophthalic acid; isophthalic acid; ammonium fluoborate; and ammonium salicylate.

8. The fluxing composition of claim 6, wherein the nitrogen containing compound liberates nitrogen at the temperatures at which the metals are soldered together.

9. The fluxing composition of claim 6, wherein the nitrogen containing compound is selected from the group consisting of 1,2-benz-3,4-anthraquinone; 1,2-benz-9,10-anthraquinone; 5,6-chrysoquinone; 6,12-chrysoquinone; 2,3-benzanthraquinone; 2-amino-isophthalic acid; 5-amino-isophthalic acid; and 5-isoquinoline carboxylonitrile.

10. The fluxing composition of claim 6, further comprising an alcoholic carrier solvent.

11. A low residue soldering flux composition, comprising:
    an alcoholic carrier solvent and an activating amount of a subliming mixture containing at least one member selected from the group consisting of 1,2-benz-3,4-anthraquinone; 1,2-benz-9,10-anthraquinone; 5,6-chrysoquinone; 6,12-chrysoquinone; 2,3-benzanthraquinone; 2-amino-isophthalic acid; 5-amino-isophthalic acid; and 5-isoquinoline carboxylonitrile and at least one member selected from the group consisting of isophthalic acid; ammonium fluoborate; and ammonium salicylate.

12. A method of soldering electronic components to a circuit carrying substrate, comprising:
    applying a fluxing composition containing an activator and a nitrogen containing compound to the circuit carrying substrate;
    heating the fluxing composition and those portions of the electronic components and the circuit carrying substrate that are to be soldered together to a temperature sufficient to cause the activator to react with metal oxides on the components and substrate and to cause the activator to sublime, and to cause the nitrogen containing compound to decompose and to liberate nitrogen.

13. The method as described in claim 11, wherein the activator comprises at least one compound selected from the group consisting of 2-amino-isophthalic acid; 5-amino-isophthalic acid; isophthalic acid; ammonium fluoborate; and ammonium salicylate.

14. The method as described in claim 11, wherein the nitrogen containing compound comprises one or more compounds selected from the group consisting of 1,2-benz-3,4-anthraquinone; 1,2-benz-9,10-anthraquinone; 5,6-chrysoquinone; 6,12-chrysoquinone; 2,3-benzanthraquinone; 2-amino-isophthalic acid; 5-amino-isophthalic acid; and 5-isoquinoline carboxylonitrile.

* * * * *